US005113365A

United States Patent [19]

Yang

[11] Patent Number: 5,113,365

[45] Date of Patent: May 12, 1992

[54] METHOD AND CHARGE COUPLED APPARATUS FOR ALGORITHMIC COMPUTATIONS

[75] Inventor: Woodward Yang, Cambridge, Mass.

[73] Assignee: Massachusetts Institute of Technology, Cambridge, Mass.

[21] Appl. No.: 352,765

[22] Filed: May 16, 1989

[51] Int. Cl.[5] .................... G06G 7/00; H01L 29/78; H04N 3/14

[52] U.S. Cl. .................... 364/807; 357/24; 358/213.23; 358/213.26; 364/844; 364/862; 364/820

[58] Field of Search .................... 364/600–608, 364/807, 841, 844, 862, 826, 819, 820; 358/213.23–213.26; 357/24; 365/183; 377/60, 61, 63

[56] References Cited

U.S. PATENT DOCUMENTS

| | | | |
|---|---|---|---|
| 3,940,602 | 2/1976 | Lagnado et al. | 364/826 |
| 4,011,441 | 3/1977 | Michon et al. | 358/166 |
| 4,041,298 | 8/1977 | Lampe et al. | 364/862 |
| 4,063,200 | 12/1977 | Mattern | 364/662 |
| 4,064,533 | 12/1977 | Lampe et al. | 358/213.26 |
| 4,120,035 | 10/1978 | Cases et al. | 364/602 |
| 4,126,852 | 11/1978 | Baertsch | 364/606 |
| 4,161,783 | 7/1979 | Wrench, Jr. et al. | 364/606 |
| 4,210,825 | 7/1980 | Crochiere et al. | 357/24 |
| 4,316,258 | 2/1982 | Berger | 364/825 |
| 4,350,976 | 9/1982 | Benoit-Gonin et al. | 357/24 |
| 4,369,378 | 1/1983 | Rockett, Jr. | 357/24 |
| 4,446,484 | 5/1984 | Powell | 358/213 |
| 4,464,726 | 8/1984 | Chiang | 364/606 |
| 4,471,341 | 9/1984 | Sauer | 357/24 |
| 4,476,568 | 10/1984 | Prince | 357/24 |
| 4,501,007 | 2/1985 | Jensen | 357/24 |
| 4,555,770 | 11/1985 | Sage | 364/826 |
| 4,581,652 | 5/1986 | Kinoshita et al. | 357/24 |
| 4,584,657 | 4/1986 | Tiemann et al. | 364/602 |
| 4,616,334 | 10/1986 | Vogelsong et al. | 357/24 |
| 4,625,293 | 11/1986 | Vogelsong et al. | 357/24 |
| 4,627,084 | 12/1986 | McIver | 357/24 |
| 4,660,090 | 4/1987 | Hynecek | 358/213.25 |
| 4,675,847 | 6/1987 | Birnbaum et al. | 365/183 |
| 4,686,648 | 8/1987 | Fossum | 357/24 |
| 4,779,005 | 10/1988 | Arnold | 358/213.26 |
| 4,785,353 | 11/1988 | Seim | 358/213.26 |
| 4,811,270 | 3/1989 | Nash | 364/862 |
| 4,831,453 | 5/1989 | Takemura | 358/213.23 |
| 4,833,636 | 5/1989 | Miida et al. | 364/819 |

FOREIGN PATENT DOCUMENTS 0332515 9/1989 European Pat. Off. .

OTHER PUBLICATIONS

Butler, J. and Kerkhoff, H. "Multiple-Valued CCD Circuits", *Computer*, (Apr. 1988), 58–69.

Fossum, E., "Charge-Coupled Computing for Focal Plane Image Processing", *Optical Engineering*, 26 (9), Sep. 1987, 916–922.

(List continued on next page.)

*Primary Examiner*—Jerry Smith
*Assistant Examiner*—Jim Trammell
*Attorney, Agent, or Firm*—Hamilton, Brook, Smith & Reynolds

[57] ABSTRACT

An array of charge coupled devices (CCD's) is used to perform algorithmic computations on a set of data. The array of CCD's divide, combine and delay the input data to produce output data corresponding to the output desired from the algorithmic computations. Data may be processed in parallel, and the array is preferably divided into pipelined multiple stages so that multiple calculations may be performed in parallel. Processing elements may be interspersed between groups of CCD's to heighten processing capability. The array is particularly useful in a focal plane image processor. In such an image processor, an imager and array are integrated and may be formed on a single chip. Such an image processor can perform Gaussian as well as Laplacian convolutions. It performs all computations in real time. Also useful in the image processor is a device that substracts electric charges and a device that implements conditional summing.

58 Claims, 11 Drawing Sheets

Bencuya, S. S., Steckle, A. J., Vogelsong, T. L. and Tiemann, J. J., "Dynamic Packet Splitting in Charge Domain Devices", *IEEE Elec. Dev. Let.*, EDL-3(9), Sep. 1982, 268-270.

Vogelsong, T., Tiemann, J. and Steckl, A., "Charge-Domain Integrated Circuits for Signal Processing", *IEEE J. Solid-State Cir.*, SC-20(2), Apr. 1985, 562-570.

Bencuya, S. and Steckl, A., "Charge-Packet Splitting in Charge-Domain Devices," *IEEE Trans on Elec. Dev.*, ED-31 (10), Oct. 1984, 1494-1501.

Schroder, D. K., "Recent Trends in Charge-Coupled Devices," *Electron Devices Society Newsletter,* Issue No. 66, 1-4, Date unknown.

Sage, J. P. and Lattes, A., "A High-Speed Analog Two-Dimensional Gaussian Image Convolver," Opt. Soc. of America, *Topical Meeting on Machine Vision,* Mar. 1985.

Botts, S. E., "New Horizons for Focal-Plane Arrays," *Photonics Spectra,* Jul. 1988, 125-128.

Chiang, A. M., "A Real Time CCD Parallel Radar Processor," *Real Time Signal Processing,* SPIE, vol. 827, (1987), 126-130.

Chiang, A. M., "A Video-Rate CCD Two-Dimensional Cosine Transform Processor," *Visual Communications and Image Proc.,* vol. 845 (1985), 2-5.

Chiang, A. M., and Burke, B. E., "A High-Speed Digitally Programmable CCD Transversal Filter," *IEEE J. Solid-State Cir.,* SC-18 (16), Dec. 1983, 745-753.

Fossum, E. R., and Barker, R. C., "A Linear and Compact Charge-Coupled Charge Packet Differencer/Replicator," *IEEE Trans Elec. Dev.,* ED-31 (12), Dec. 1984, 1984-1989.

Gandolfo, D. A. and Tower, J. R., "Analog Binary Programmable Transversal Filter," *Interim Report,* RCA Advanced Tech. Labs Under U.S. Air Force Contract, Jun. 1979.

Chiang, A. M., "CCD Retina and Neural Net Processor," Lincoln Laboratory, Date unknown.

Chiang, A. M. and Rader, C. M., "A 256-Point CCD FFT Chip," Lincoln Laboratory, Date unknown.

Fossum, E. R., "A Novel Trench-Defined MISIM CCD Structure for X-Ray Imaging and Other Applications", Date unknown.

Beaudet, P. R., "CCD Focal Plane Convolver (Smart Eyeball)," FD6-1-FD6-4, Date unknown.

$$\overline{B2} = \frac{A2 + B1 + B3 + C2}{4} \qquad \frac{1}{8}\begin{bmatrix} 0 & 1 & 0 \\ 1 & 0 & 1 \\ 0 & 1 & 0 \end{bmatrix}$$

subtract B2 from $\overline{B2}$ so that $\frac{1}{8}\begin{bmatrix} 0 & 1 & 0 \\ 1 & -4 & 1 \\ 0 & 1 & 0 \end{bmatrix}$ $$\frac{a2 + b1 - 4b2 + b3 + c2}{8}$$

$$\overline{X2} = \frac{X1 + 2X2 + X3}{4}$$

METHOD AND CHARGE COUPLED APPARATUS FOR ALGORITHMIC COMPUTATIONS

BACKGROUND

Charge coupled devices (CCD's) are semiconductor devices that encode information as quantities of electric charge. Conventional semiconductor devices, in contrast, generally represent information as current levels or voltage levels. This characteristic of CCD's provides them with the benefit of easy transfer of data. As such, an array of closely situated CCD's can readily act as a shift register. Another benefit derived from the use of CCD's is that the charge they store can be sensed non-destructively and hence, the charge can still be used for further applications after being previously sensed.

To date, the use of CCD's in image processing has been quite limited. Current efforts have primarily been limited to exploiting the shifting capability of CCD's or using the CCD's as cameras to convert image data into quantities of electric charge.

SUMMARY OF THE INVENTION

The present invention includes a device for performing algorithmic computations. This device has a plurality of data inputs to a charge coupled array. Data that is input via these inputs to the charge coupled array is encoded as quantities of electric charge. The array is comprised of charge transfer means by which adjacent input charges are divided and combined in sequential stages of the array. This combining and dividing produces output data encoded as charges that correspond to an algorithmic combination of the input charges.

This device preferably combines at least portions of each piece of input data with at least portions of two local data inputs. Thus, each of a substantial range of adjacent data inputs are combined with neighboring data encoded as charges in a like manner. The net result of the combinations is a production of parallel output data encoded as charges corresponding to a repeated algorithmic combination of local inputs. The data also preferably is input in parallel. Output is preferably generated in real time.

The present invention includes devices and methods for performing both Laplacian and Gaussian convolutions on a set of data. A two dimensional Gaussian convolution is accomplished by performing a Gaussian convolution on columns of data and a Gaussian convolution on rows of data. The separate convolutions are performed by separate portions of an array of charge coupled devices (CCD's) through which data is passed. Each of these portions of the array are comprised of sets of columns of CCD's. A plurality of sets of columns may be used.

The present invention preferably includes a clocking means. The clocking means clocks data into at least one set of columns every clock cycle as well as between adjacent columns within each set of columns.

Additionally, the present invention includes an imager having an array of pixels divided into rows and columns. A processing means is connected to the imager for performing desired calculations on pixel data values generated from the imager. The processing means is comprised of a plurality of CCD's that are organized into groups. The first column of the array receives data value inputs in parallel. Also included in the image processor is a plurality of processing elements. The processing elements are preferably CCD devices but may be conventional processors situated between successive groups of CCD's and in communication with the groups of CCD's. They manipulate the data values to perform desired calculations. Preferably, the processing means is integrated on a common semiconductor with the imager to perform real time image processing chip.

Preferably the processing means is pipelined so that the pixel data may be clocked into the processing means a column at a time in parallel. The pipeline may be divided so that one stage performs a Laplacian convolution of the data and one stage performs a Gaussian convolution. The stage that performs a Gaussian convolution may be comprised of two substages: one that acts upon rows and one that acts on columns. Such parallel data input is preferably acted on by the processing elements in parallel. Furthermore, it is preferred that the processing elements act upon spatially localized neighborhoods of pixel data values.

Two other devices are included within the present invention. The first is a semiconductor device that subtracts two quantities of electric charge. It is comprised of a substrate, and an insulating layer deposited on a substrate. Two gate structures are deposited on the insulating layer. Each gate structure is comprised of two differently constructed gates closely situated so that charge may flow freely between them. The gate structures are each attached to separate voltage sources that correspond to the quantities of electric charge to be subtracted. Additionally included is an input diode to flood the gates with electric charge.

The second device is a charge coupled device that can be used for conditionally summing quantities of charge. It is comprised of a region that separates the device into two gates. A wall can be raised or lowered in response to a signal. The result of raising the wall is to prevent input charges from summing. If lowered, the wall does not prevent charges from summing between the two gates. The signal may be generated by a charge sensing device that generates a signal in response to a function of the charge values entering each of the two respective gates.

DETAILED DESCRIPTION

Typical charge coupled devices include an array of gates on a semiconductor substrate. By applying a potential to a gate and applying a lower potential to adjacent gates, a potential well is formed below the gate. If a charge is applied to the well, it is retained therein so long as the surrounding potential walls are maintained. The charge may be transferred from below one gate to below another gate by proper timing of gating potentials. By raising the potential below the gate holding the charge and lowering the potential below the next, the charge can be caused to flow to the next gate. Charge coupled devices are well known and are described in greater detail in works such as S. Sze, *Physics of Semiconductor Devices,* p.p. 407–430, (2nd Edition 1981).

Figure 1B:
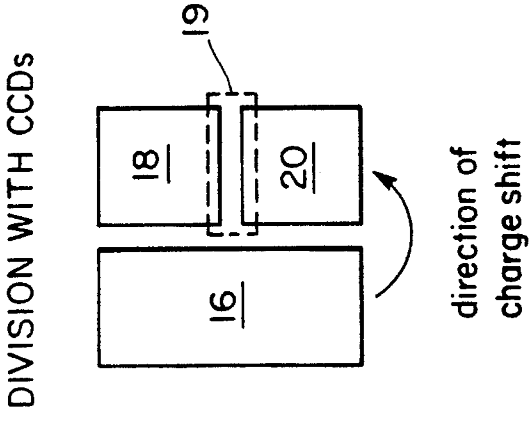
FIGS. 1*a* and 1*b* illustrate example mathematical functions that may be implemented with charge coupled devices (CCD's).
Figure 1A:
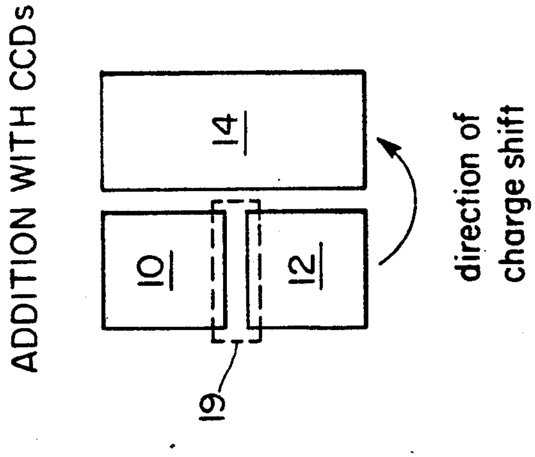

Charge coupled devices (CCD's) i ed to implement simple mathematical functions in the charge domain. FIGS. 1*a* and 1*b* illustrate two sample mathematical operations that may be performed with CCD's. The rectangles shown in FIGS. 1*a* and 1*b* are plan views of CCD gates. In FIG. 1*a*, the quantity of electric charge held in CCD 10 and the quantity of charge held in CCD 12 are shifted into CCD 14 resulting in CCD 14 having a quantity of charge equal to the sum of the individual charges previously held in CCD 10 and in CCD 12.

FIG. 1*b* illustrates a configuration of CCD's that performs a division of charge. In particular, the quantity of charge initially held in CCD 16 is divided evenly between CCD 18 and CCD 20. The CCD's 18 and 20 are separated by a non-conductive wall 19 that prevents recombination of the charge as the charge is transferred. The net result of the charge transfer is a division of the charge originally held in CCD 16 by two. The extent of division is a function of the geometry of the electrodes of the CCD's to which the charge flows. For example, if four CCD's, each having electrodes one fourth the size of the CCD 16, were situated in FIG. 1*b* where CCD's 18 and CCD 20 are currently situated, the quantity of charge originally held in CCD 16 would be divided evenly into fourths amongst the four destination CCD's.

This mathematical capability of CCD's is employed in the preferred embodiment of the present invention to implement several algorithmic computations. However, before delving into the details of these algorithmic computations, there are certain features of CCD's that will be highlighted. First, the above described mathematical computations are performed exclusively in the charge domain. Second, the shifting of quantities of charge from one CCD to another is very easily accomplished in CCD's as noted in the Background section. Third, CCD's are very simple electrical structures that are readily fabricated. Fourth, CCD's are analog devices. Hence the present invention operates on analog values and as such operates very quickly. These characteristics suggest that performing algorithmic computations with CCD's can be done with minimal expense and with minimal effort.

Figure 2:
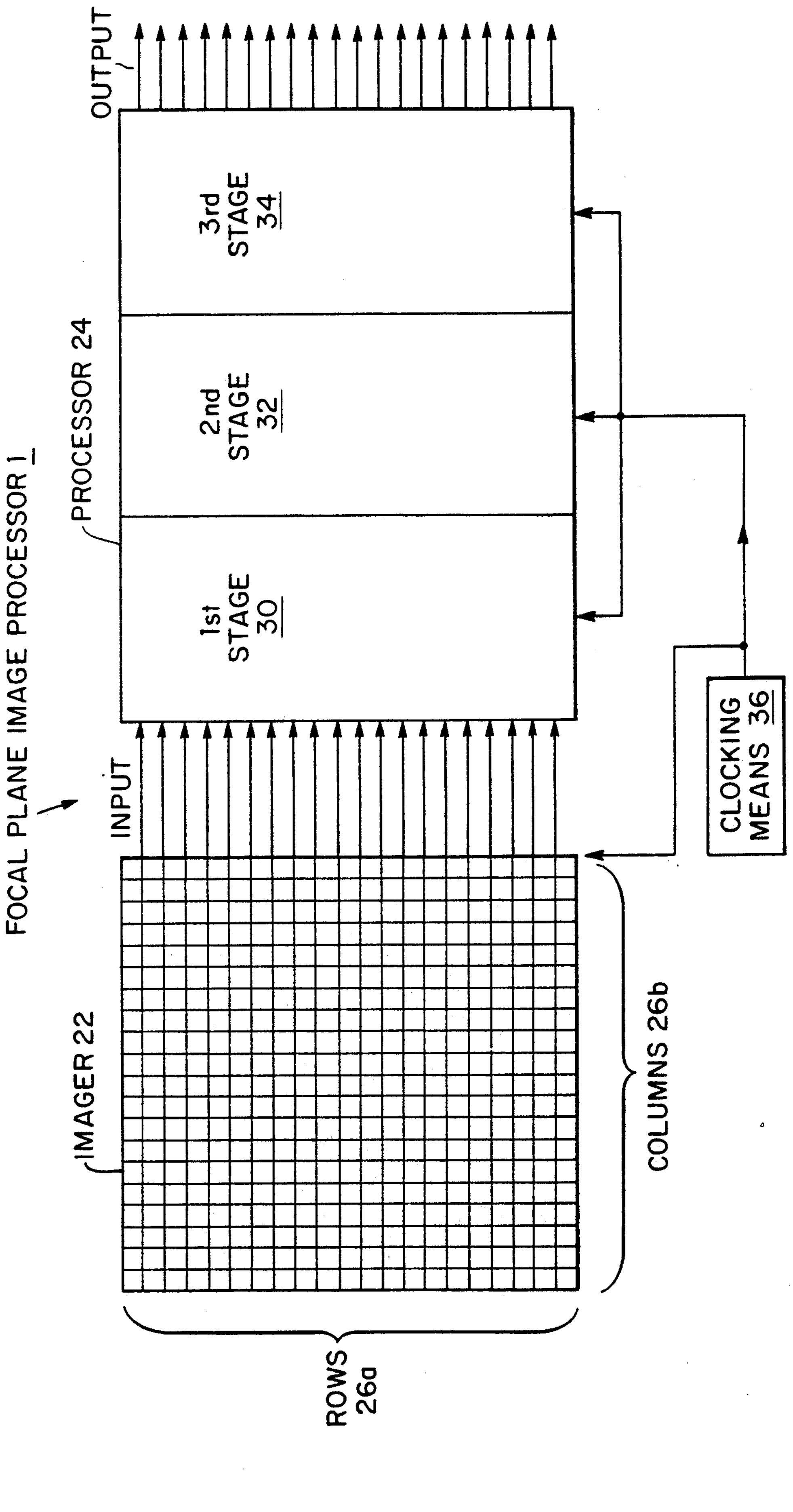
FIG. 2 shows the focal plane image processor of a preferred embodiment of the present invention.

According to one aspect to the preferred embodiment of the present invention, a focal plane image processor includes an imager 22 and processor 24 as shown in FIG. 2. The imager 22 is directly integrated with the processor 24 so that data may be processed locally at the focal plane site. The imager is comprised primarily of a plurality of pixels that are divided into rows 26*a* and into columns 26*b*. The pixels may be constructed of CCD's or of other devices. The use of CCD's with a photovoltaic layer such as silicon is desirable because it eliminates the need for conversion into the charge domain prior to passing the data into the processor 24, for in CCD imagers the image is automatically converted into the charge domain by the CCD.

The processor 24 is, in essence, a large array of CCD's. The CCD's in this array are best viewed as being comprised of a series of pipeline stages 30, 32, 34. What these stages actually do will be described in more detail below, but it is useful to view each as performing separate functions. Moreover, although three stages are shown in the current embodiment, the present invention encompasses other configurations. The function and number of pipeline stages in the focal plane image processor 1 is dependent upon the particular operation that the processor is designed to perform.

In basic terms, an image is flashed on to the imager 22. This results in excitation of pixel elements in the imager 22. As a result of the excitation, each pixel produces a value that encodes information relating to the part of the image that struck the pixel. If photovoltaic CCD's are used as pixels, the data is encoded as quantities of charge. Once data is generated, the processor 24 then begins processing the data.

The data is clocked out of the imager 22 a column 26*b* at a time in parallel using a clocking means 36. This column of data enters the input column of the first stage 30 of the processor 24. During the next clock cycle the next column 26*b* of the imager 22 is clocked into this input column of the first stage 30 of the processor 24 by the clocking means 36. The column of data that was previously in the input column 30 of the processor 24 is at the same time clocked into the next column of the first stage 30. The net result of this configuration is that columns of data can be processed in parallel at different points in the pipeline structure 0, 32 and 34. The columns of data flow through the stages 30, 32, 34 of the processor 24 until all the data has been appropriately processed. The desired output is extracted from the output columns of the third stage 34 of the processor 24. Then, and only then, is the output converted into conventional voltage levels and placed on a data bus.

Figure 3:
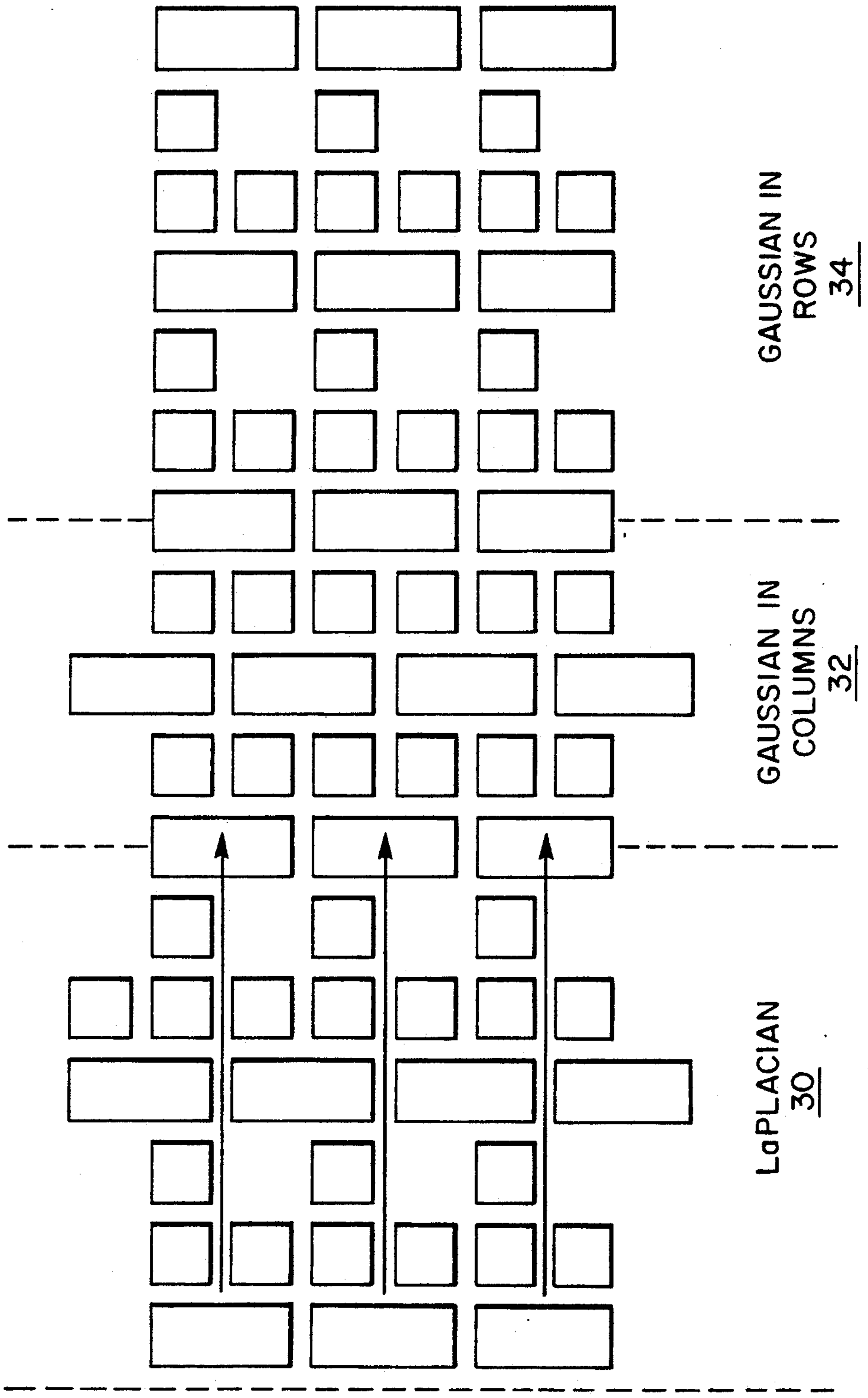
FIG. 3 shows a more detailed view of the processor of a preferred of the present invention.

The focal plane image processor 1 shown in FIG. 2 is designed to provide edge detecting capability. In particular, the processor 24 is divided into three functional stages 30, 32 and 34 that are very useful in edge detection. The first stage 30 performs Laplacian convolution of the data. The second stage 32, in contrast, performs a Gaussian convolution of columns of the data, and the final stage 34 performs a Gaussian convolution of rows of the data. The processor 24 is shown in more detail in FIG. 3. It should be noted that although the stages are shown in a particular order for this given application, the order of the stages is not critical, for the present invention embodies all particular orderings of these stages.

Laplacian convolutions and Gaussian convolutions are particularly useful in edge detection. The physical sensing process and data conversion process of an imager often produce a great deal of unwanted extraneous noise. The Gaussian convolution provides a means of minimizing the effect of this noise. The effect of employing the Gaussian convolution is similar to employing a low pass filter. The Laplacian convolution, on the other hand, is not aimed at eliminating noise, rather it is aimed primarily at determining points of great change in intensity. Experience indicates that such points of great change in intensity tend to be edge locations. Thus, in sum, Gaussian convolutions clean up the image signal, whereas Laplacian convolutions serve as detectors of potential edge locations.

The Laplacian convolution stage or first stage 30 of the processing means 24 is comprised of a set of columns of CCD's. These columns of CCD's are used to implement a convolution with a particular mask. In this embodiment, the following mask is used:

$$1/8\begin{bmatrix} 0 & 1 & 0 \\ 1 & -4 & 1 \\ 0 & 1 & 0 \end{bmatrix}$$

In other words, each pixel data value generated within the imager 22 is manipulated to generate a new corresponding Laplacian pixel data value output. The mask indicates how the output pixel data values are generated from the input pixel data values. In particular, the center element in the mask matrix corresponds to the input pixel data value for which a resulting output pixel data value is generated. The remaining elements of the mask matrix refer to the pixel data values located at positions in the imager 22 immediately surrounding the central pixel data value. For instance, the element at row 1, column 2, refers to the pixel data value located immediately above the central pixel data value.

The numbers in the mask matrix indicate the magnitude of the weighting given the pixel data values in generating the Laplacian pixel data value output. Specifically, the mask indicates that the Laplacian pixel data value that is produced by summing the surrounding pixel values in accordance with the surrounding pixel values weights denoted by the numbers in the mask matrix (i.e. 0 or 1) along with negative four times the central pixel data value. This sum is divided by eight to produce the final pixel data value output.

The operator indicated by the mask is performed for every pixel in the imager 22. Hence, the overall function performed by the processor 24 can actually be viewed as implementing a plurality of overlapping masks, each mask like the one shown above. Further, it should be noted that the present invention is not limited to this particular mask. It encompasses using masks with different weighings as well as masks having greater or fewer elements.

Figures 4A, 4B:
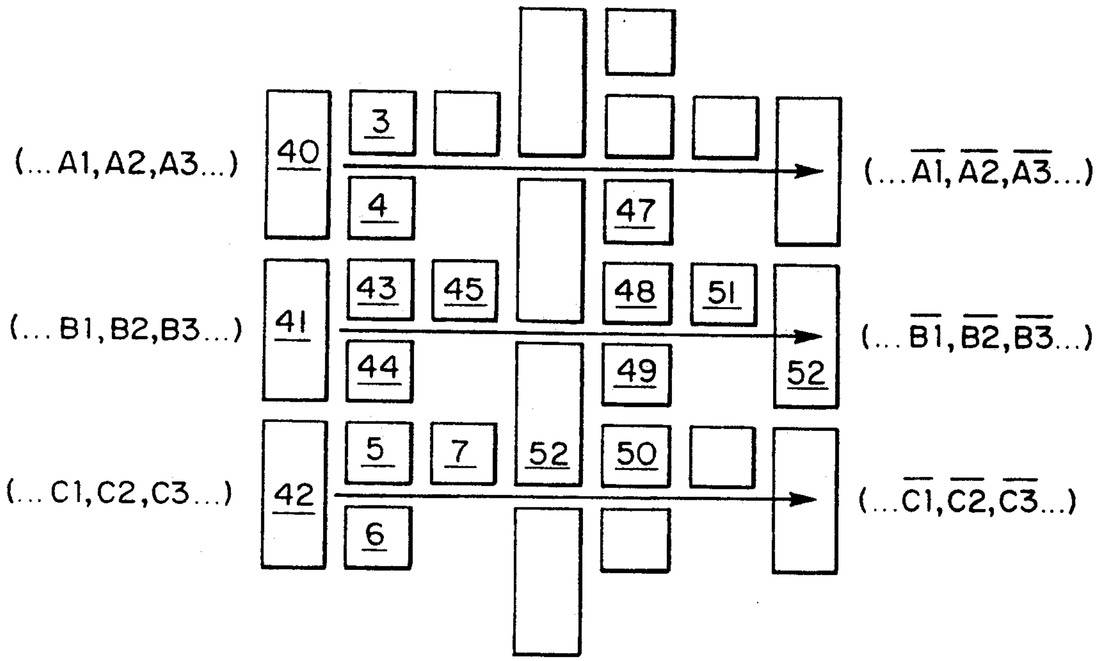
FIGS. 4*a*, 4*b* and 4*c* show the structure and strategy employed to perform a Laplacian convolution using CCD's in a preferred embodiment of the present invention.

How the CCD configuration shown in FIG. 4*a* implements this mask is perhaps best illustrated by example. Suppose that (A1, A2, A3), (B1, B2, B3), and (C1, C2, C3) are inputs into the CCD structure shown. Further, suppose that the corresponding outputs are (A1', A2', A3'), (B1', B2', B3') and (C1', C2', C3'). The structure generates an output B2' that equals (A2+B1+B3+C2)/8. For purposes of clarity, each of the pixel data value that contributes to the Laplacian pixel data values will be discussed separately below.

Figure 4C:
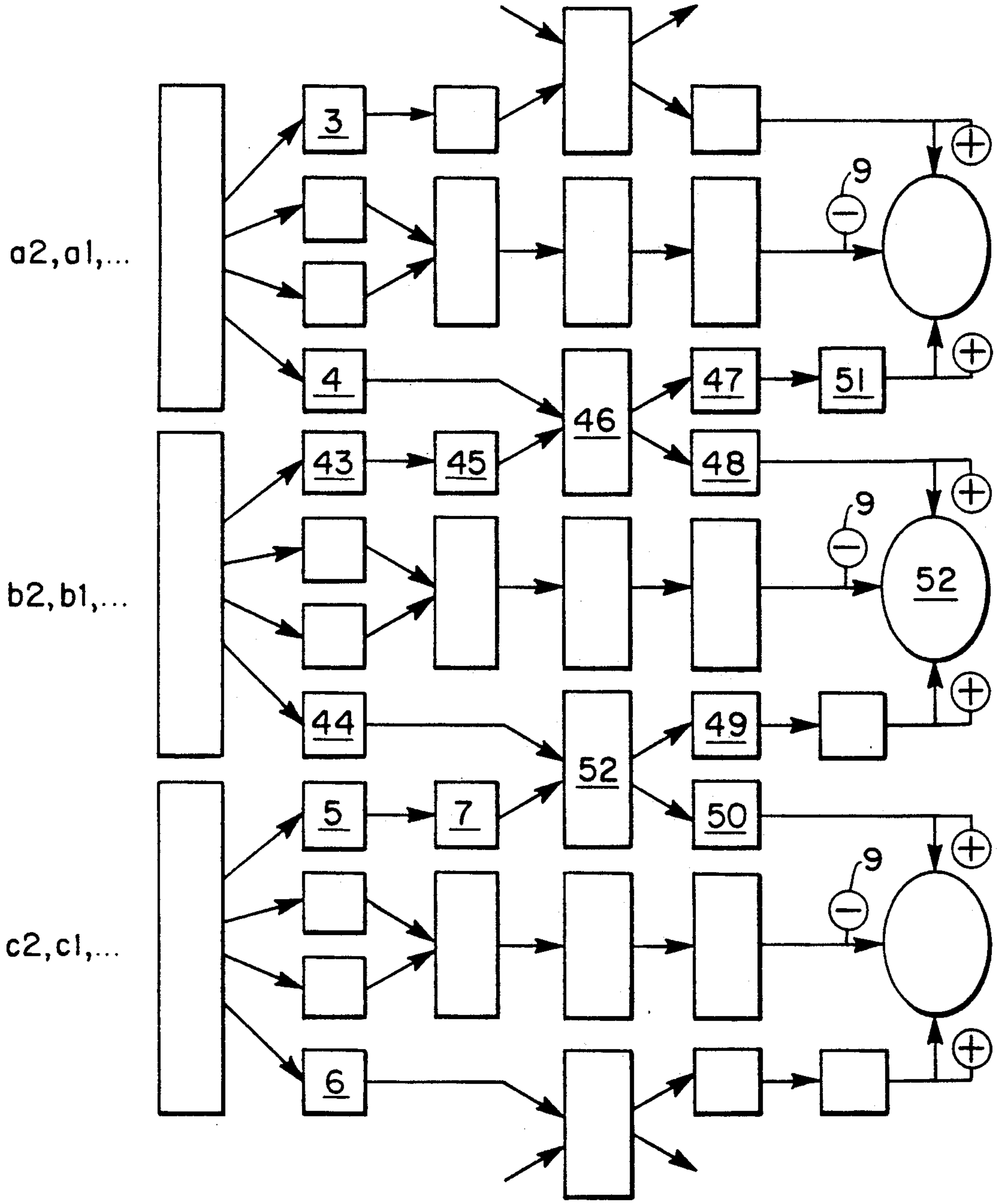

In order to implement the desired mask, the ability to subtract charges is necessary. How the subtractor occurs is discussed in more detail below. Suffice it to say at this point that one half of the charge passes directly to the subtractor devices 9. For purposes of simplification, the CCD gates through which the half charges pass to the subtractor devices 9 and the subtractor devices 9 are represented by the bold arrows shown in FIG. 4*a*. FIG. 4*c* shows the system of 4*a* in more detail.

A2 enters CCD 40 during the second clock cycle. The charge represented by A2/2 (i.e. the amount of charge initially held in CCD 40 that does not go to the subtractor device 9) propagates towards the right of FIG. 4*a*. During the third clock cycle, A2/2 is passed to CCD's 3 and 4 in equal halves. In the next clock cycle, a half (A2/4) is clocked out of CCD 4 into CCD 46 where it is summed with another charge. Specifically, it is summed with (B3/4).

During the first clock cycle B3 is clocked into CCD 41. Then, in the second clock cycle a quarter of it is divided between CCD 41 and CCD 44. The quarter (B3/4) charge initially held in CCD 43 is passed on to CCD 45 during the third clock cycle. As a result, in the fourth clock cycle, B3/4 is clocked into CCD 46 at the same time A2/4 is clocked into CCD 46. Within CCD 46, they are summed to produce a quantity of charge equal to (A2 +B3)/4.

In the fifth clock cycle, this sum (A2 +B3)/4 is passed on equally to two CCD's 47 and 48. The quantity held in CCD 48 is (A2+B3)/8. During the sixth clock cycle, this amount of charge is passed on to CCD 51, and finally, in the seventh clock cycle, it is passed on to CCD 52.

C2 is clocked into CCD 42 during the second clock cycle. Half of C2 is divided into fourths of charge held in CCD's 5 and 6 during the third clock cycle. The fourth of charge held in CCD 5 is passed on to CCD 7 in the fourth clock cycle. This quantity is subsequently passed o to CCD 52 in the fifth clock cycle along with B1/4. B1 had been clocked into CCD 41 during the third clock cycle. A fourth of B1 was passed on to CCD 44 in the fourth clock cycle. That fourth, in turn, was passed to CCD 52 in the fifth clock cycle.

CCD 52 sums these quantities of charge to produce a charge equal to (B1+C2)/4. In the sixth clock cycle, the quantity of charge previously held in CCD 52 (i.e. (B1+C2)/4) is divided into halves by passing the charge to CCD's 49 and 50. As a result, in the seventh clock cycle, (B1+C2)/8 is passed to CCD 52 from CCD 49 along with (A2+B3)/8 passed from CCD 51.

The charge at CCD 52 during the seventh clock cycle equals the charge produced by the mask shown at the top of FIG. 4*b*. However, the mask sought is not this mask but rather is the mask shown in the bottom of FIG. 4*b*. To implement the mask at the bottom of FIG. 4*b*, the processor 24 need only subtract B2 from B2'. This is done by the use of subtractor devices denoted as 9 in FIG. 4*c* and shown in greater detail in FIGS. 5*a* and 5*b*.

The above-described example for B2' illustrates the strategy employed to perform the Laplacian convolution. The structure suggested in FIG. 4*a* also results in similar calculations being performed on the other data inputs. Thus, A2' is present on an output CCD at the same time B2' is present on CCD 52. Furthermore, in the eighth clock cycle, B1' is present on CCD 52. As a result, this structure calculates a Laplacian Convolution on a set of data in parallel and in a pipelined manner.

Figure 5A:
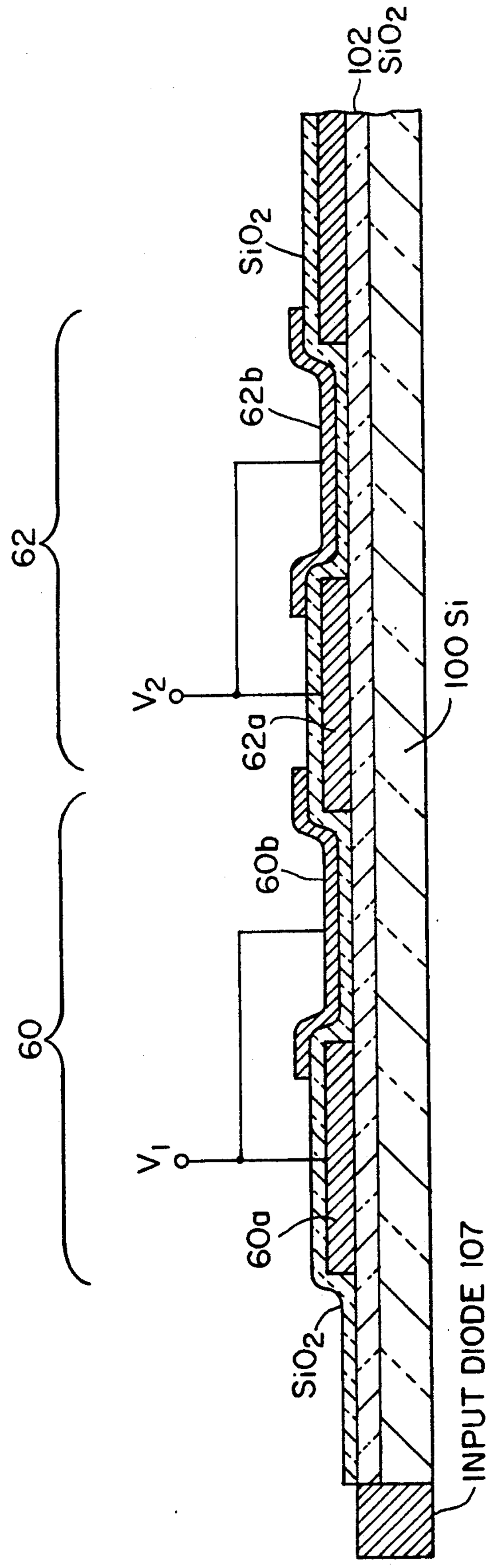
FIGS. 5*a* and 5*b* show the basic structure of the subtractor device of a preferred embodiment of the present invention.

FIG. 5*a* illustrates the basic structure of the subtractor device 9 used in the Laplacian convolution. As can be seen in FIG. 5*a*, the subtractor device 9 has a semiconductor substrate 100 preferably comprised of silicon. On this substrate 100 is deposited a layer of $SiO_2$ or other insulating material 102. Gate structures 60 and 62 are formed on top of the insulating layer 102. Each of these gate structures 60 and 62 is comprised of two separate overlapping gates *60a, 60b*, and *62a, 62b* respectively. These gates are closely situated so as to allow electric charge to freely flow between the gates of the respective structures.

The design was chosen to assure that spacing between gate structures 60 and 62 can be determined by the controlled thickness of an insulating layer 101, yet the gate structures are identical so that they both have the same response to a given voltage level. As such, the difference in depth of wells can be attributed solely to differences in applied voltage due to difference in charge.

The two gate structures 60 and 62 are each connected separately to individual voltages V1 and V2, respectively. The two structures 60 and 62 are separated by only a small gap so that electric charge may flow unhampered from one gate structure to the other under the proper conditions. The magnitude of an appropriate gap is dependent on the geometry employed.

Figure 5B:
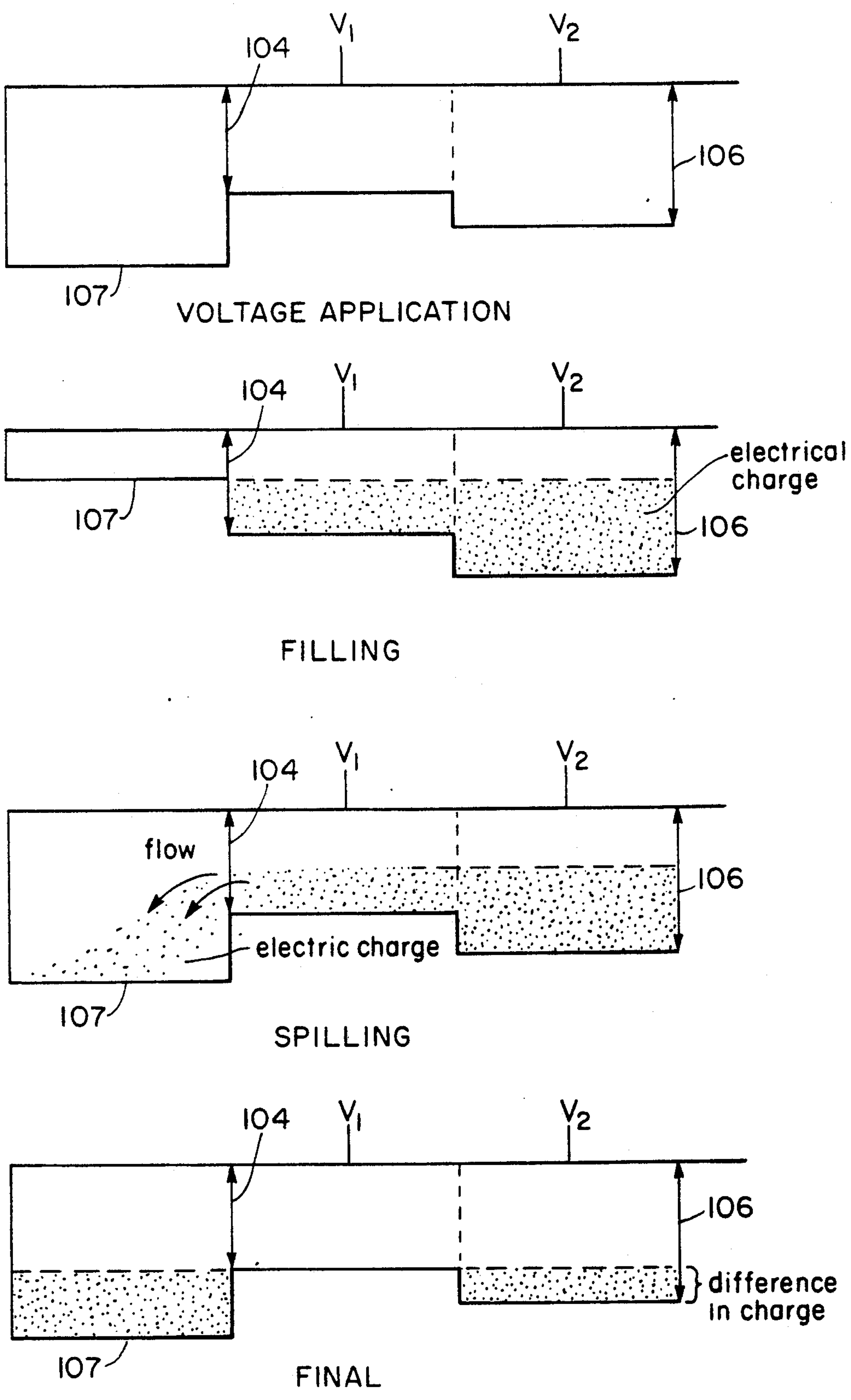

FIG. 5*b* illustrates how the subtractor operates. The operation of the subtractor 9 can be divided into four steps: voltage application, filling, spilling, and final. These four steps are depicted in FIG. 5*b*.

In the voltages application stage, voltages corresponding to the separate quantities of charge to be subtracted are applied to the gate structures 60 and 62. This can be readily done from CCD's because CCD's are capacitor structures that generate voltages corresponding to the amount of electric charge they are holding. Application of these voltages to the gate structures produces potential wells having depths corresponding to the magnitude of the applied voltage. For instance, applying voltages V1 and V2 might produce well depths 104 and 106 respectively as shown in FIG. 5*b*. Having established appropriate well depths, subtractor 9 performs the filling stage.

In the filling stage, the subtractor 9 applies enough voltage to the input diode 107 to flood both wells (i.e. fill them to the limit) with electric charge. Once flooded, as shown in FIG. 5*b* the voltage is shut off so that all of the excess electric charge will spill into a well at the input diode 107. All that remains is the quantity of electric charge equal to the difference in well depth between 104 and 106 as shown in the final stage of FIG. 5*b*. This amount of charge corresponds to the difference in electric charge between the charges to be subtracted. This amount can be measured to perform the desired subtraction.

The specific materials suggested are only for the preferred embodiment. The present invention, however, embodies the use of other appropriate materials. Further, the present invention encompasses other configurations as well.

Once the Laplacian convolution of the data is completed, it is desirable to perform a two-dimensional Gaussian convolution on the data. This is performed by performing two separate binomial convolutions. One binomial convolution is performed on the columns and a second is performed on the rows. As mentioned previously, the order in which convolutions are performed is not important. The Laplacian convolution may even be performed in between the two Gaussian convolutions. Whatever the order, the two-dimensional Gaussian convolution is performed by doing two separate one-dimensional convolutions.

Separating the processing of columns of data and the processing of rows of data into separate stages provides a number of benefits. One of the primary benefits is that it provides a good balance between input/output bandwidth and number of processing elements required. In particular, with an imager having a grid of $N \times N$ pixels, the number of outputs produced per clock cycle is equal to the number of pieces of data in a column of data (i.e. N). This is a reasonable bandwidth. At the same time, only N processing elements are required (i.e. one for each piece of data in a row or a column) as opposed to $N \times N$ processors.

Figure 6:
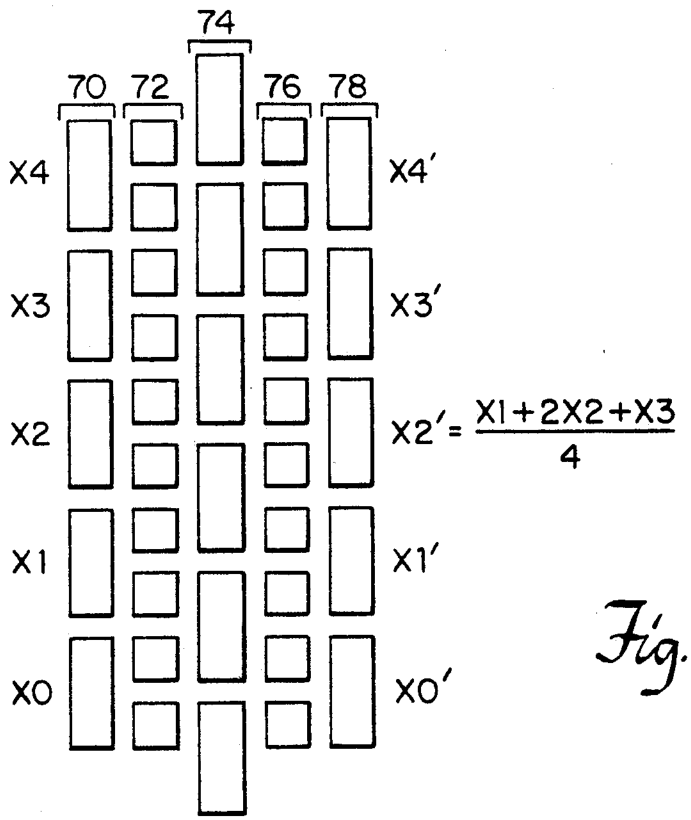
FIG. 6 shows the structure employed to perform a Gaussian convolution on columns of data using CCD's in a preferred embodiment of the present invention.
Figure 7A:
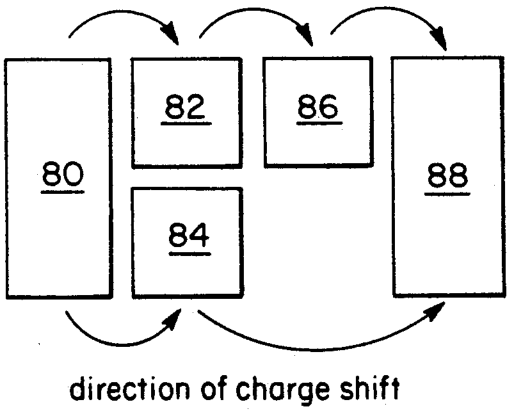
FIGS. 7*a* and 7*b* show the structure employed to perform a Gaussian convolution on rows of data using CCD's in a preferred embodiment of the present invention.
Figure 7B:
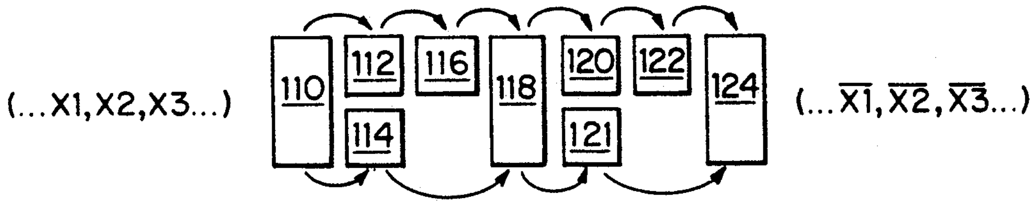
Figure 8:
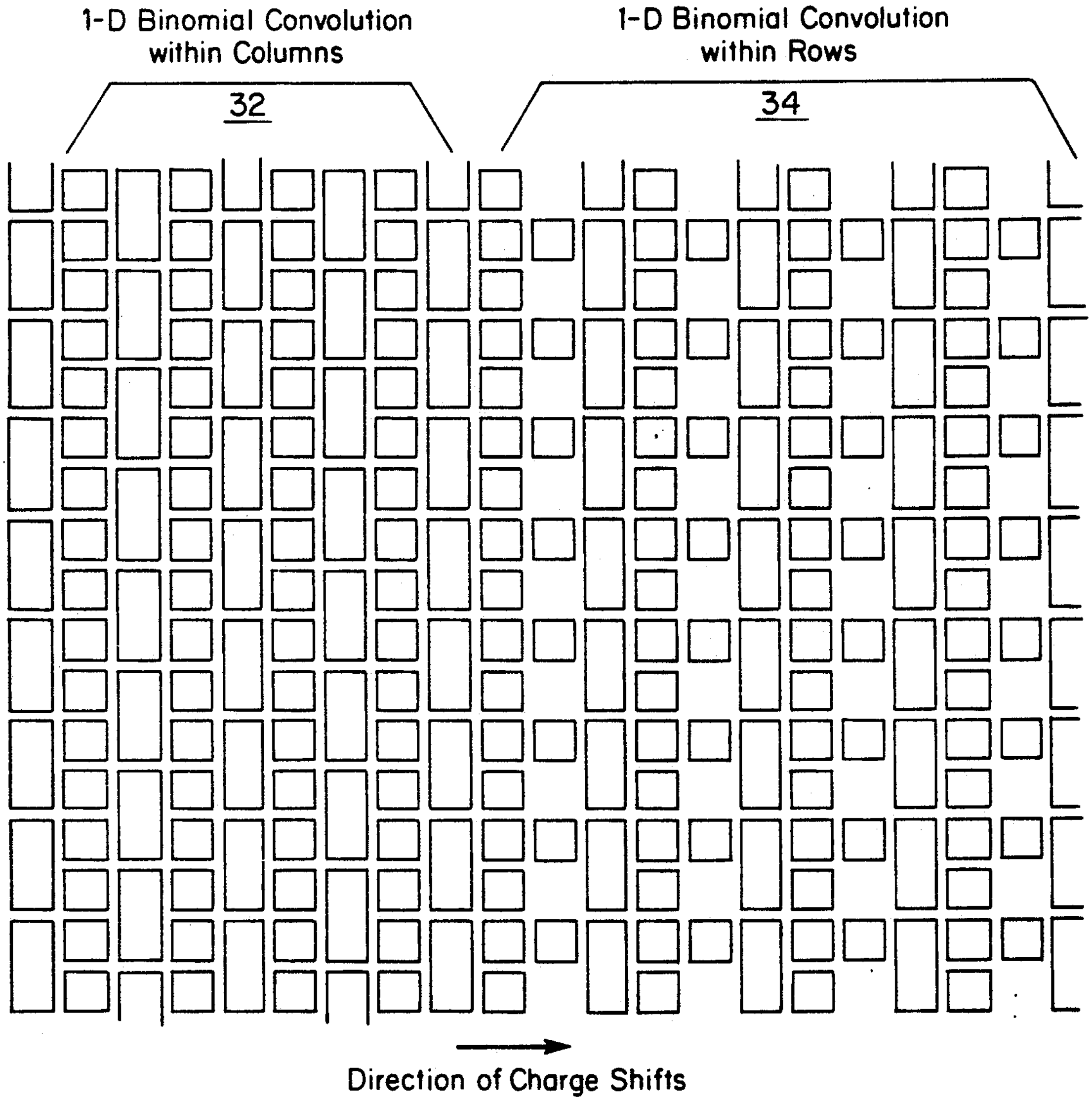
FIG. 8 shows the spatial relationship between the second and third stages of the processor in a preferred embodiment of the present invention.

FIG. 6 shows the basic strategy and structure employed in the second stage 32 of the processor 24 to perform a Guassian convolution of the data in columns. Column 70 in FIG. 6 is the input column into the second stage 32 of the processor 24. This column is also the output column from the previous first stage 30 of the processing means. Data is clocked out of Column 70 into Column 72 where each pixel is divided into two equal halves. These equal halves are then summed with halves from neighboring input CCDs in the third Column 74. The resulting sum is halved in Column 76. Lastly, the halves passed to two separate CCD's of Column 76 are each passed to different adjacent output CCD's in Column 78.

The net result of this strategy is to produce a binomial output at each of the output CCD's in Column 78. For example, the output labelled X2' is equal to $(X1+2\times2+\times3)/4$. Following the path of the charges from the input CCD's in Column 70 to the output CCDs in Column 78 will confirm this fact. Hence, for each piece of data input entering Column 70, a resulting binomial output is produced at Column 78. By adding additional similarly constructed sets of columns after this first set of columns, one can obtain a stage 32 that performs a more extended Guassian convolution on the columns. Such a stage 32 is included within the present invention.

The strategy employed to perform Guassian convolutions along rows implements the same binomial function used with columns but utilizes a different CCD architecture. FIG. *7a* illustrates the basic structure employed. In particular, an input charge encoding a piece of data enters an input CCD such as CCD 80. This input charge is then divided into two equal halves by passing half of the charge to CCD 82 and half of the charge to CCD 84. In the next subsequent clock cycle, half of the original charge is passed from CCD 82 to the delay CCD 86, whereas the other half of the original charge is passed from CCD 84 directly on to CCD 88. The half charge held in CCD 86 is passed on to CCD 88 in the next clock cycle.

FIG. *7b* shows the use of the structure depicted in FIG. *7a* employed in series form to implement the Guassian convolution of a row of data. Suppose that X1, X2, X2 and X3 are inputs into the series of CCD's and that X1', X2' and X3' are the outputs. X2' has a value equal to $(X1+2\times2+X3)/4$. How it gets that value can be seen by looking to table 1. As indicated in table 1 at clock cycle 7 the charge at CCD 124 (i.e. X2') is equal to $(X1+2\times2+S3)/4$. Similarly, during the next clock cycle, the series generates a Guassian convolution amongst the next series of data in the row. Additional series of CCD's may be added to the final stage 34 to generate a more extensive Guassian convolution of the rows.

TABLE I

| gate | Clock Cycle 1 | 2 | 3 | 4 | 5 | 6 | 7 |
|---|---|---|---|---|---|---|---|
| 110 | X3 | X2 | X1 | — | — | — | — |
| 112 | — | (X1/2) | (X2/2) | (X3/2) | — | — | — |
| 114 | — | (X1/2) | (X2/2) | (X3/2) | — | — | — |
| 116 | — | — | (X1/2) | (X2/2) | (X3/2) | — | — |
| 118 | — | — | (X1/2) | $\frac{X1 + X2}{2}$ | $\frac{X2 + X3}{2}$ | — | — |
| 120 | — | — | — | (X1/4) | $\frac{X1 + X2}{4}$ | $\frac{X2 + X3}{4}$ | — |
| 121 | — | — | — | (X1/4) | $\frac{X1 + X2}{4}$ | $\frac{X2 + X3}{4}$ | — |
| 122 | — | — | — | — | $\frac{X1}{4}$ | $\frac{X1 + X2}{4}$ | $\frac{X2 + X3}{4}$ |
| 124 | — | — | — | — | — | $\frac{2X1 + X2}{4}$ | $\frac{X1 + 2X2 + X3}{4}$ |

— = don't care condition for present purposes

After data has traversed the entire processor 24 (i.e. stages 30, 32 and 34), both the Laplacian convolution and the two dimensional Guassian convolution have been performed on the data. The resulting output from the third stage 34 is already processed and ready to be forwarded to a traditional processor for further processing. The preferred embodiment of the present invention enables a user of the image processor 1 to have the data preprocessed upon leaving the imaging plane. Moreover, the scheme employed is quite fast and efficient. It is able to process image data in real time at a rate of least of 28 frames per second.

Several aspects of the present invention have been discussed in the context of a focal image plane processor. It should be noted, however, that the invention embodies a wider spectrum than merely a focal plane image processor. Rather the CCD structures described herein have uses in other applications. For instance, the Laplacian and Guassian structures can be utilized in signal processing apparatuses. Likewise, the described subtractor device can be used in any application in which it useful to operate in the charge domain.

Figure 9:
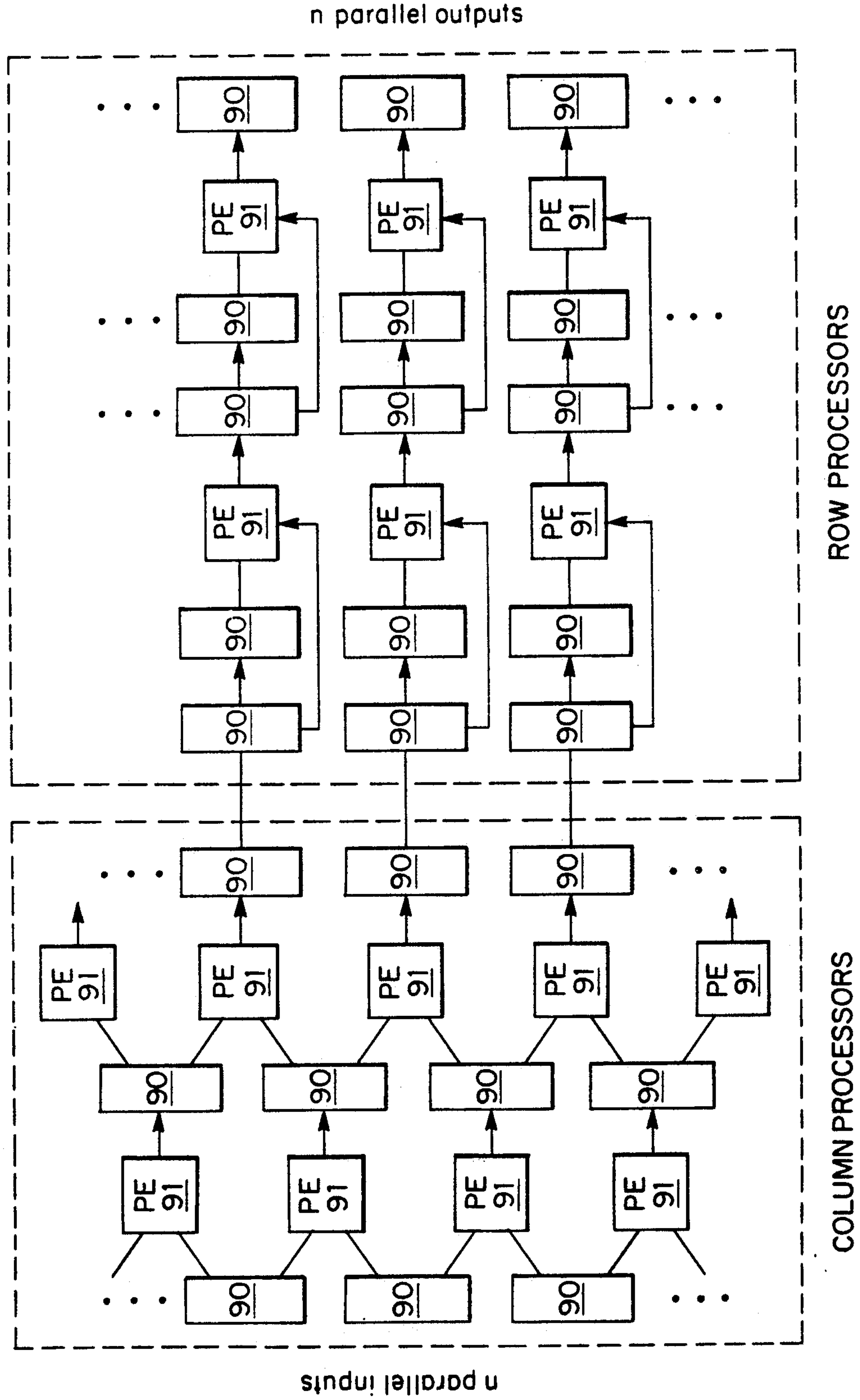
FIG. 9 shows an alternate embodiment of a focal plane image processor.

The preferred embodiment of the present invention also includes a focal plane image processing scheme that intersperses processing elements within an array of CCDs. FIG. 9 illustrates one potential design of such an embodiment. In accordance with this aspect of the preferred embodiment of the present invention, pixel data is held on the CCD's 90 and then forwarded to processing elements 91. These processing elements 91 act upon spatially localized neighborhoods of pixel data to perform various calculations. In essence, the CCD's described in the previous aspect of the preferred embodiment of the present invention can be viewed as types of processing elements. However, the processing elements 91 specifically described herein generally refer to elements having more sophisticated capabilities and may operate in the conventional voltage domain.

One environment in which the present invention is useful is in processing data by columns and rows. As is shown in FIG. 9, the structure consisting of CCDs 90 and processing elements 91 is divided into two distinct stages. In the first stage, the processing elements 91 act upon adjacent localized columns of data and in the second stage, the processing elements 91 act upon adjacent row elements of data.

Figure 10A:
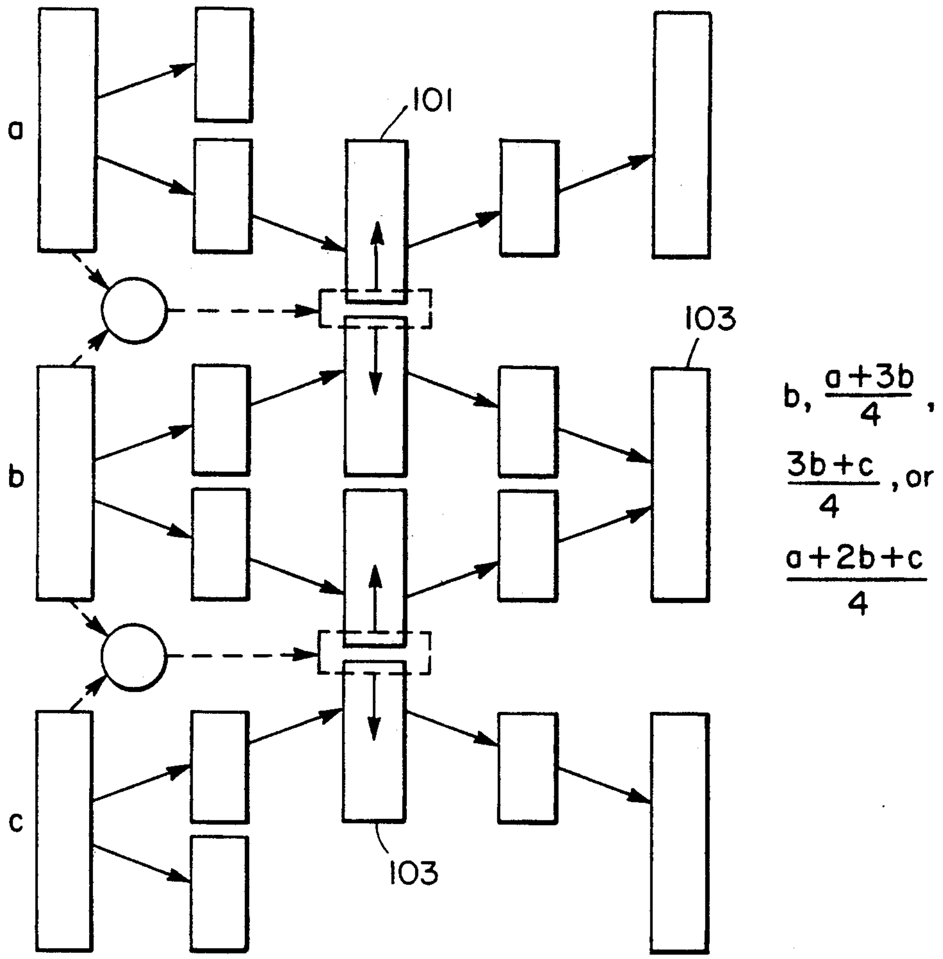
FIGS. 10*a* and 10*b* show a conditional summing CCD device and sample usage of the device.
Figure 10B:
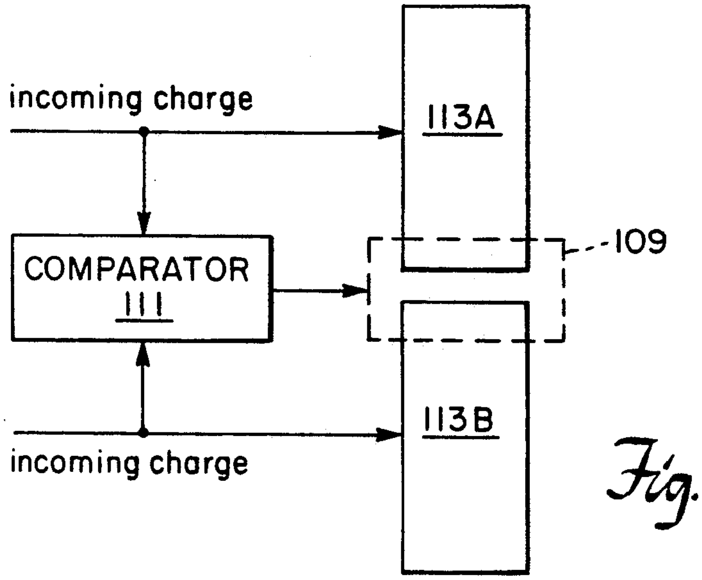

Another aspect of the preferred embodiment of the present invention, concerns a unique CCD structure. As is shown in FIG. 10*a* and 10*b*, the CCD structures labelled 101 each have a central region in which a wall is capable of being raised or lowered. The wall is physically embodied as a semiconductor region controlled by a gate. FIG. 10*b* shows the device 101 in more detail. It is comprised of two gates 113*a* and 113*b* separated by the wall. The comparator 111 checks for a given condition which causes it to generate a signal. Specifically, if the comparator 111 finds a condition to be true, it generates a signal applied to the gate 109 to raise the wall. If the condition is false, it generates a signal to lower the wall or vice versa. The central point is that the wall is raised or lowered in response to a given condition.

The wall enables one to employ a conditional summing that does not add charges when the difference between data on opposite sides of the wall exceeds a known threshold. The comparator 111 checks the difference between the charges to determine if a signal to raise the wall should issue. If the wall is raised, the data is not summed by the CCD structure 101. On the other hand, if the wall is lowered, the data is summed in the CCD structure 101. This type structure 101 can be particularly useful in an environment such as image processing.

As an example, suppose that A, B and C shown in FIG. 10*b* represent image intensity values for pixels derived from an image. If the difference between A and B or between B and C is too large, then, for some purposes one probably does want to add these values. It is not desirable to add these values because if they are added, the resulting output will be unnecessarily blurred. By measuring the magnitude of the two values entering the CCD structure 101, the structure enables on raise or lower the partition based on these values. The four possible output values at CCD 103 of FIG. 10*a* are *b*, (a+3b)/4, (3b+c)/4, or (a+2b+c)/4. This type device provides the image processor designer with a great deal more power and flexibility in implementing given algorithms than traditional designs.

While the invention has been particularly shown and described with reference to preferred embodiments thereof, it will be understood by those skilled in the art that various changes in form and details may be made without departing from the spirit and scope of the invention as defined in the appended claims.

I claim:

1. A method of performing algorithmic computations on a set of data comprising the steps of:

a. inputting the set of data into a plurality of inputs as column vectors of a charge coupled device (CCD) array so that each piece of data in the set of data is encoded as a quantity of electric charge on the inputs; and b. dividing, combining and delaying in sequential stages of the array of quantities of electric charge that encode adjacent pieces of data to produce data encoded as quantities of charge at outputs of the array.

2. A method as recited in claim 1 wherein the algorithmic computations are arithmetic computations.

3. A method as recited in claim 1 wherein the method performs a Guassian transformation on the set of data.

4. A method as recited in claim 1 wherein the method performs a Laplacian operation on the set of data.

5. A method as recited in claim 1 wherein the data is input in parallel.

6. A method of performing algorithmic computations on a two-dimensional set of data comprising the steps of a. inputting the set of data as column vectors into a plurality of inputs of a charge coupled device (CCD) array so that each piece of data in the set of data is encoded as a quantity of electric charge on the inputs;

b. dividing and combining in sequential stages of the array the quantities of electric charge that encode pieces of data wherein at least portions of each piece of data encoded at the inputs are conditionally combined with at least portions of data encoded as charges held in neighboring array elements such that each of a plurality of adjacent pieces of data encoded as charge is conditionally combined with at least portions of data encoded as charges held in corresponding neighboring array elements to produce output data.

7. A device for performing algorithmic computations comprising:

a. a plurality of inputs to a charge coupled array wherein a set of input data is encoded as quantities of electric charge;

b. the array comprising charge transfer means by which adjacent pieces of input data encoded as charges are divided and combined in sequential stages of the array of produce output data encoded as charges.

8. A device as recited in claim 7 wherein at least portions of each input encoded as charge is combined in sequential stages with at least portions of at least two neighboring inputs encoded as charges, each of a plurality of adjacent inputs encoded as charges being further combined with at least portions of neighboring data encoded as charges to produce parallel output data encoded as charges corresponding to a repeated algorithmic combination of neighboring inputs encoded as charges.

9. A device as recited in claim 8 wherein the inputs receive data in parallel as column vectors.

10. A device as recited in claim 8 wherein the inputs receive data from a charge coupled device imager.

11. A device as recited in claim 8 wherein the algorithmic computations performed by the device are arithmetic computations.

12. A device as recited in claim 11 wherein the device performs a binomial convolution of the data.

13. A device as recited in claim 11 wherein the device calculates a Laplacian convolution of the data.

14. A method of computing a binomial convolution of a set of data using an array of charge coupled devices (CCD's) comprising the steps of:

a. encoding data input received in parallel as quantities of electric charge in a set of CCD's;

b. using CCD's to divide each value of data in the set of data into fractional values; and c. adding the fractional values of adjacent values of data using CCD's to determine the average of the adjacent values that constitute elements of the binomial convolution of the set of data.

15. A method as recited in claim 14 wherein the data input is received in parallel as column vectors.

16. A method as recited in claim 15 wherein the column vectors are received serially.

17. A method as recited in claim 14 further comprising the step of repeating steps b and c using the average computed in step c as the data divided in step b.

18. A method of performing a two dimensional binomial convolution on a two-dimensional set of data comprised of rows and columns using an array of charge coupled devices (CCD's), comprising the steps of a. performing a binomial convolution on the columns of data by passing the data through a first portion of the array of CCD's, each piece of data in each column being encoded as a quantity of electric charge which is divided and combined in sequential stages of the first portion of the array;

b. performing a binomial convolution on the rows of data by passing the data through a second portion of the array of CCD's, each piece of data in each row being encoded as a quantity of electric charge which is divided, delayed and combined in sequential stages of the second portion of the array;

wherein these steps produce the two dimensional binomial convolution at outputs of the array of CCD's.

19. A method of computing a binomial convolution of a set of data using array of charge coupled devices (CCD's), comprising the steps of:

a. inputting the set of data in parallel to an input column of CCD's in the array of CCD's so that the data is encoded as quantities of electric charge;

b. passing the data encoded as quantities of electric charge on to a next column of CCD's in the array such that the data values encoded as electric charge held in each CCD in the input column of CCD's is passed in equal halves to a pairs of CCD's in the next column of CCD's; and c. for each pair of CCD's in the next column comprising the two equal halves of data from a CCD of the input column, passing the half value of data encoded as a quantity of electric charge held in a first CCD of each pair of CCD's along with the half value of data encoded as a quantity of charge held in a second CCD of an adjacent pair of CCD's to a destination CCD in a final column to generate an element in the binomial convolution of the set of data encoded at the destination CCD such that the final column has electric quantities indicative of data elements of the binomial convolution of the set of data.

20. A method as recited in claim 19 wherein steps b and c are repeated to produce a larger, higher order binomial convolution.

21. A method of computing a binomial convolution of a set of data using an array of charge coupled devices (CCD's), comprising the steps of a. inputting a first piece of data in the set of data into a first CCD so that the first piece of data is encoded as quantity of electric charge;
b. passing the first piece of data on to a second CCD and a third CCD such that half of the quantity of electric charge encoding the first piece of data passes to the second and third CCD's;
c. at the same time that the first piece of data is passed on to the second and third CCD's, inputting a second piece of data in the set of data into the first CCD so that the second piece of data is encoded as a quantity of electric charge;
d. subsequently, passing the half data value encoded as a quantity of electric charge of the first piece of data in one of the second and third CCD's to a delay CCD and passing the half data value encoded as a quantity of electric charge of the first piece of data in another of the second and third CCD's to a destination CCD;

passing the second piece of data on to the second and third CCD's such that half data value encoded as a quantity of electric charge encoding the second piece of data passes to each of the second and third CCD's; and e. then, passing the half data value encoded as quantity of electric charge of the first piece of data in the delay CCD to the destination CCD along with the half data value encoded as a quantity of electric charge of the second piece of data from one of the second and third CCD's to generate an element in the binomial convolution of the set of data encoded at the destination CCD;

passing the half data value encoded as a quantity of electric charge of the second piece of data from another of the second and third CCD's to the delay CCD;

f. repeating steps a–e with remaining pairs of data in the set of data to generate additional elements of the binomial conversion.

22. A device for computing a binomial convolution of a set of data comprising at least one set of columns of charge coupled devices (CCD's), each set of columns comprising:

a. a first column of CCD's for receiving in parallel data encoded as quantities of charges;
b. a second column of CCD's in communication with the first column of CCD's for dividing data encoded as quantities of charge in the first column into halves wherein the second column has a pair of CCD's associated with each CCD in the first column; and
c. a third column of CCD's in communication with the second column of CCD's comprising a plurality of CCD's wherein each CCD of the plurality in the third column receives the half data values encoded as charge a second CCD of a first pair of the second column along with the half data value encoded as charge from a first CCD of a second pair of the second column that is adjacent to the first pair;

wherein the quantities of charge present on CCD's in the third column encode elements of the binomial convolution.

23. A device as recited in claim 22 wherein there are a plurality of sets of columns.

24. A device as recited in claim 22 further comprising a clocking means for clocking data into at least one set of columns every clock cycle and to clock data from column to column within at least one set of columns every clock cycle.

25. A device for computing a binomial convolution of a set of data comprising at least one set of columns of charge coupled devices (CCD's), each set of columns comprising:

a. a first column of CCD's for receiving in parallel data encoded as quantities of charges;
b. a second column of CCD's in communication with the first column of CCD's for dividing the data encoded as quantities of charge in the first column into halves wherein the second column has a pair of CCD's associated with each CCD in the first column;
c. a third column of CCD's in communication with selected CCD's in the second column of CCD's for delaying a half data value encoded as a quantity of charge present in one of the pairs of CCD's in the second column; and
d. a fourth column of CCD's in communication with the third column of CCD's and in communication with those CCD's in the second column of CCD's not in communication with the third column of CCD's, for receiving and summing the half data values encoded as charges from the CCD's with which it communicates; wherein the data encoded as quantities of charge present in the fourth column constitute elements of the binomial convolution.

26. A device as recited in claim 25 further comprising a clocking means for clocking input into at least one set of columns and for clocking input from column to column within at least one set of columns.

27. A device as recited in claim 25 wherein there are a plurality of sets of columns.

28. A device of computing a two dimensional binomial convolution of a set of column vectors and row vectors of data comprising:

a. a first set of columns of charge coupled devices (CCD's) for performing a binomial convolution on the column vectors of the data comprising:
   1) a first column of CCD's for receiving in parallel data encoded as quantities of charges;
   2) a second column of CCD's in communication with the first column of CCD's for dividing data encoded as quantities of charge in the first column into halves wherein the second column has a pair of CCD's associated with each CCD in the first column; and
   3) a third column of CCD's in communication with the second column of CCD's comprising a plurality of CCD's wherein each CCD of the plurality in the third column receives the half data values encoded as charge from a second CCD of a first pair of the second column along with the half data value encoded as charge from a first CCD of a second pair of the second column that is adjacent to the first pair; wherein the quantities of charge present on CCD's in the third column encode elements of the binomial convolution; and
b. a second set of columns of CCD's in communication with the first set of columns for performing a binomial convolution of the row vectors of the data comprising:

1) a first column of CCD's for receiving in parallel data encoded as quantities of charges;
2) a second column of CCD's in communication with the first column of CCD's for dividing data encoded as quantities of charge in the first column into halves wherein the second column has a pair of CCD's associated with each CCD in the first column; and
3) a third column of CCD's in communication with selected CCD's in the second column of CCD's for delaying a half data value encoded as a quantity of charge present in one of the pairs of CCD's in the second column; and
4) a fourth column of CCD's in communication with the third column of CCD's and in communication with those CCD's in the second column not in communication with the third column of CCD's, for receiving and summing the half data values encoded as charges from the CCD's with which it communicates; wherein the data encoded as quantities of charge present in the fourth column constitute elements of the binomial convolution.

29. A device as recited in claim 28 wherein the first and the second sets of columns operate in parallel.

30. A device as recited in claim 28 where the sets of columns divide, combine and delay and column vectors and the row vectors of data to produce output data corresponding to an algorithmic combination of the data.

31. A method of performing a Laplacian convolution on a two-dimensional set of data using an array of change coupled devices (CCD's), comprising two steps of a. inputting the set of data into the array of (CCD's) so that the set data is encoded as individual quantities of electric charge;
b. within the array, for each piece of data dividing the data into fourths using CCD's of the array; delaying at least one of the fourths of each piece of the data using with a delay CCD; summing at least another one of the fourths of the data with at least one delayed fourth of an adjacent piece of data using CCD's of the array and subsequently dividing the summed fourths of data into halves; such that data encoded as quantities of charge held at CCD's on a final column of the array is comprised of elements of the Laplacian convolution.

32. A focal plane image processor comprising:

a. an imager having an array of pixels comprised of rows of pixels and columns of pixels;
b. a processing mean for performing desired calculations on pixel data values generated from the imager, comprising a plurality of charge coupled devices (CCD's) organized into groups for storing data values, a first column of which receives the pixel data values input; and
c. a plurality of processing elements that manipulate the data values to perform two-dimensional calculations where the processing elements are situated between successive groups of CCD's and are in communication with said groups of CCD's.

33. A focal plane image processor as recited in claim 32 further comprising a clocking means for clocking data into the processor means from the imager in parallel as column vectors.

34. A focal plane image processor as recited in claim 33 wherein the processing means is pipelined so that the pixel data may be clocked into the processing means a column vector at a time.

35. A focal plane image processor as recited in claim 32 wherein the processing elements act upon spatially localized neighborhoods of pixel data values.

36. A focal plane image processor as recited in claim 32 wherein the processing elements perform calculations in parallel.

37. A focal plane image processor as recited in claim 32 where the image processor performs the desired calculations in real time.

38. A focal plane image processor as recited in claim 32 wherein the processing means and imager are formed on a single integrated chip.

39. A method of performing computations on pixel data using a focal plane image processor comprising the steps of:

a. passing the pixel data in columns from an imager that generated the pixel data to a processing means;
b. in the processing means, encoding the pixel data as quantities of electric charge on a group of charge coupled devices (CCD's);
c. manipulating the pixel data with processing elements that are in communication with the CCD's to perform two-dimensional computations.

40. A method as recited in claim 39 wherein the step of passing the pixel data passes the data in parallel.

41. A method as recited in claim 39 wherein the step of manipulating data acts on spatially localized pixel data values.

42. A method as recited in claim 39 further comprising the steps of:

storing the manipulated pixel data in a group of CCD's;
further manipulating the manipulated pixel data with processing elements in communication with the groups of CCD's; and
repeating the above steps if additional manipulation of the pixel data is desired.

43. A method as recited in claim 39 that performs the computation in real time.

44. A focal plane image processor comprising:

a. an imager having an array of pixels;
b. a processing means for performing desired calculations on pixel data values generated from the imager, the processor means comprising an array of charge coupled devices (CCD's) that receives the pixel data values from the imager, encodes the pixel data values in columns as quantities of electric charge, and divides and combines adjacent pixel data values encoded as quantities of electric charges in sequential stages of he array of CCD's to produce columns of output values encoded as quantities of charge corresponding to a two-dimensional algorithmic combination of the input charges.

45. A focal plane image processor as recited in claim 44 wherein the imager is comprised of rows and columns of pixels.

46. A focal plane image processor as recited in claim 44 further comprising a clocking means that clocks pixel data values from the imager to the processing means in parallel.

47. A focal plane imager as recited in claim 46 wherein the clocking means clocks the pixel data values through successive stages of the processing means.

48. A focal plane imager as recited in 46 wherein groups of pixel data values are clocked into the processing means every successive time frame generated by the clocking means so that calculations on pixel data values may be performed in parallel.

49. A focal plane image processor as recited in claim 46 wherein the imager is comprised of rows and columns of pixels and pixel data values are clocked into the processing means a column at a time.

50. A focal plane image processor as recited in claim 44 wherein the processing means is pipelined into different stages that perform separate functions.

51. A focal plane image processor as recited in claim 50 wherein the stages are comprised of sets of columns of CCD's that are interconnected between columns.

52. A focal plane image processor as recited in claim 50 wherein the pipeline comprises a stage that performs a binomial convolution of the pixel data values and a stage that performs a Laplacian of the pixel data values.

53. A focal plane image processor as recited in claim 50 wherein the pipeline comprises a stage that performs computations on columns of the pixel data values and a stage that performs computations on rows of the pixel data values.

54. A focal plane image processor as recited in claim 44 wherein the CCD's act upon spatially localized neighborhoods of pixel data values.

55. A focal plane image processor as recited in claim 44 wherein at least portions of input pixel data values are combined in sequential stages of the array of CCD's with at least portions of at least two local pixel data values in a spatially localized neighborhood such that each pixel data value in a neighborhood is combined with at least portions of other pixel data values to produce parallel output data values corresponding to a repeated algorithmic combination of the input pixel data values.

56. A charge coupled device for subtracting two quantities of charge comprising a. a first gate structure comprised of two distinct overlapping gates of different configuration;

b. a second gate structure identical to the first gate structure and closely enough situated to the first gate structure so that charge may flow from one gate structure to the other;

c. a substrate on which the gate structures are deposited;

d. a first charge source of the two quantities of charge, for applying a first voltage to the first gate structure wherein the first voltage applied corresponds to the magnitude of one of the two quantities of charge;

e. a second charge source of the two quantities of charge, for applying a second voltage corresponds to the magnitude of the other of the two quantities of charge;

f. an input diode for supplying electric charge to the gate structure; and g. a third voltage source for applying a third voltage to the input diode.

57. A charge coupled device for conditionally summing quantities of charge comprising:

a potential barrier, separating the device into two gates, that can be raised or lowered in response to a signal, wherein if raised the potential barrier prevents charges on the two gates from being summed and if lowered, the potential barrier allows charges on the two gates to be summed; and a charge sensing device that generates the signal to raise or lower the potential barrier in response to the charge values being input on the two gates of the device.

58. A device as recited in claim 57 wherein the charge sensing device generates a signal in response to the difference in charge values on the two gates of the device.

* * * * *

UNITED STATES PATENT AND TRADEMARK OFFICE

CERTIFICATE OF CORRECTION

PATENT NO. : 5,113,365

DATED : May 12, 1992

INVENTOR(S) : Woodward Yang

It is certified that error appears in the above-identified patent and that said Letters Patent is hereby corrected as shown below:

In Claim 1, Column 11, Line 12, change "array of quantities" to ---array the quantities---.

In Claim 22, Column 13, Line 60, change "as charge a second CCD" to ---as charge from a second CCD---.

In Claim 28, Column 14, Line 39, change "a device of computing" to ---a device for computing---.

In Claim 44, Column 16, Line 52, change "sequential stages of he array" to ---sequential stages of the array---.

Signed and Sealed this

Seventh Day of September, 1993

Attest:

BRUCE LEHMAN

*Attesting Officer* *Commissioner of Patents and Trademarks*